United States Patent [19]

Shieh et al.

[11] Patent Number: 5,468,656

[45] Date of Patent: Nov. 21, 1995

[54] METHOD OF MAKING A VCSEL

[75] Inventors: Chan-Long Shieh, Paradise Valley; Michael S. Lebby, Apache Junction; John Lungo, Mesa, all of Ariz.

[73] Assignee: Motorola, Schaumburg, Ill.

[21] Appl. No.: 346,558

[22] Filed: Nov. 29, 1994

[51] Int. Cl.⁶ .................................................. H01L 21/265
[52] U.S. Cl. .......................... 437/23; 437/126; 437/129; 437/133
[58] Field of Search .............................. 437/23, 129, 22, 437/126, 127, 133

[56] References Cited

U.S. PATENT DOCUMENTS

| | | | |
|---|---|---|---|
| 4,958,202 | 9/1990 | Kinoshita et al. | 437/23 |
| 5,164,329 | 11/1992 | Moyer et al. | 437/23 |
| 5,256,596 | 10/1993 | Ackley et al. | 437/129 |
| 5,293,392 | 3/1994 | Shieh et al. | 437/129 |
| 5,317,587 | 5/1994 | Ackley et al. | 437/129 |
| 5,341,002 | 8/1994 | Plumb | 437/23 |
| 5,387,543 | 2/1995 | Ackley | 437/129 |
| 5,388,120 | 2/1995 | Ackley et al. | 372/99 |

Primary Examiner—Kevin M. Picardat
Attorney, Agent, or Firm—Gary F. Witting

[57] ABSTRACT

A substrate with a surface, the surface having disposed thereon a first stack of distributed Bragg reflectors, an active area, a second stack of distributed Bragg reflectors, a contact region, and a dielectric layer is provided. A first isolation trench is formed that extends through the dielectric layer, the contact region, and into a portion of the second stack of distributed Bragg reflectors. A dielectric layer is disposed on the substrate. A second isolation trench is formed through the nitride layer, the contact region, the second stack of distributed Bragg reflectors, the active region and a portion of the first stack of distributed Bragg reflectors, wherein the second isolation trench encircles the first isolation trench. A first electrical contact is formed on the second stack of distributed Bragg reflectors and a second electrical contact is formed on the contact region.

8 Claims, 3 Drawing Sheets

METHOD OF MAKING A VCSEL

FIELD OF THE INVENTION

This invention relates, in general, to optical devices and, more particularly, to vertical cavity surface emitting lasers.

BACKGROUND OF THE INVENTION

This application is related to copending application bearing Ser. No. 08/346,559 entitled VERTICAL CAVITY SURFACE EMITTING LAYER HAVING CONTINUOUS GRADING, having Attorney Docket No. CR94-108 filed on Nov. 29, 1994, and assigned to the same assignee which is hereby incorporated herein.

Conventional edge emitting semiconductor lasers are playing a significant role in development of optical communications due to their high operating efficiency, small size and modulation capabilities. However, with increasing performance and manufacturing needs, reduction in size, these devices have severe limitations.

Recently, there has been an increased interest in a new type of laser device called a vertical cavity surface emitting laser (VCSEL). The VCSEL has a potential of several advantages, such as a smaller size, higher performance, and more manufacturable. However, to date, the VCSEL has not been able to fulfill these potential advantages due to a variety of problems, such as poor manufacturability, high power consumption, high series resistance, poor current confinement, and the like.

As can be seen, conventional structures and methods of fabrication of VCSEL devices do not meet requirements that are necessary for high volume manufacturing. Further, since conventional structures of VCSEL devices do not provide a low power consumption conventional structures of VCSEL devices are not suitable for low power applications. Therefore, a structure that is highly manufacturable and provides a low power consuming device would be highly desirable.

DETAILED DESCRIPTION OF THE DRAWINGS

Figure 1:
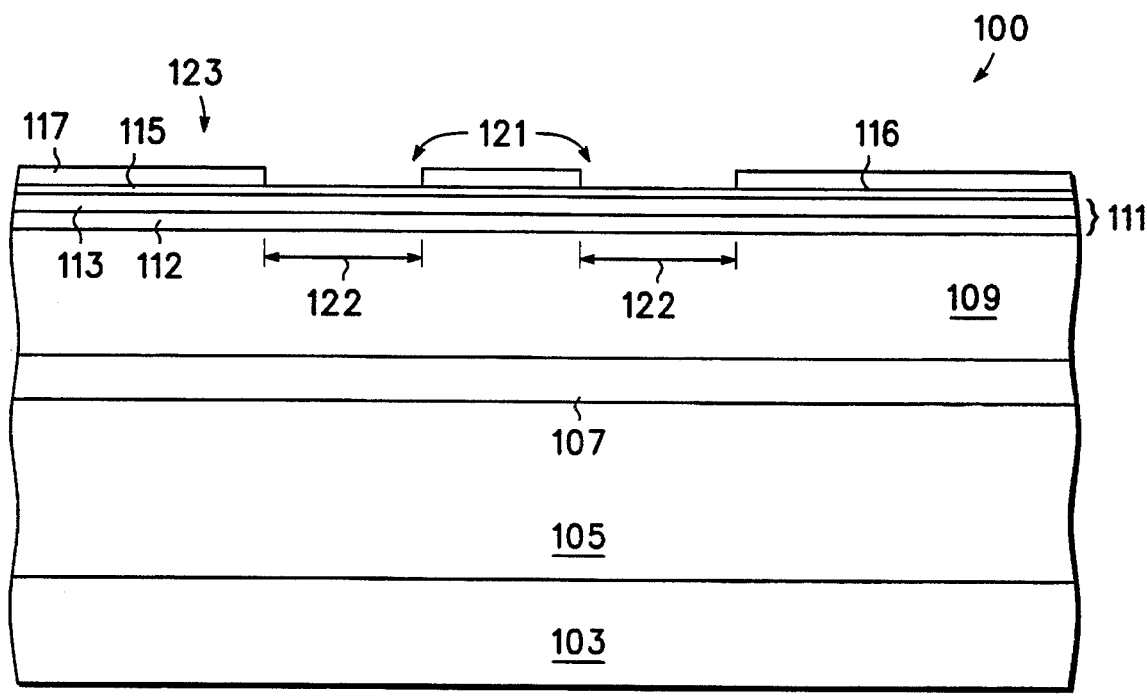
FIG. 1 is a sectional view of a substrate, an active area, a first and a second stack of distributed Bragg reflectors, and a contact region of a partially completed ridge vertical cavity surface emitting laser.

FIG. 1 illustrates a partially fabricated vertical cavity surface emitting laser (VCSEL) 100. As shown in FIG. 1, the partially fabricated VCSEL 100 illustrates several elements or features, such as a substrate 103, a first stack of distributed Bragg reflectors 105, an active area 107, a second stack of distributed Bragg reflectors 109, a contact region 111 including layer 112 and a conductive layer 113, layer 115 having surface 116, masking layer 117, and openings 121 with a size 122. While partially fabricated VCSEL 100 illustrates a single device, it should be understood that many devices can be fabricated on substrate 103. Additionally, it should be further understood that FIGS. 1–6 are sectional views, thus illustrations depicted in FIGS. 1–6 can extend into and out of the drawings.

Generally, substrate 103 is made of any suitable semiconductor material, such as gallium arsenide, silicon, sapphire, or the like. However, in a preferred embodiment of the present invention, substrate 103 is made of gallium arsenide, thereby facilitating subsequent growth of additional gallium arsenide and it's derivatives.

The first and the second stacks of distributed Bragg reflectors 105 and 109, active area 107, and layer 112 of contact region 111 are disposed or grown on substrate 103 by any suitable epitaxial method or technique, such as Metal Organic Chemical Vapor Deposition (MOCVD), Molecular Beam Epitaxy (MBE), Chemical Beam Epitaxy (CBE), or the like.

Additionally, the first and the second stacks of distributed Bragg reflectors 105 and 109, as well as active area 107 generally are made layers of aluminum gallium arsenide. The first and the second stacks of distributed Bragg reflectors 105 and 109 are made to include alternating layers that alternate in aluminum concentration Additionally, the first and the second stack of distributed Bragg reflectors 105 and 109 are alternately doped with either a p-type dopant or an n-type dopant. For example, the first stack of distributed Bragg reflectors 105 can be doped with the n-type dopant, whereas the second stack of distributed Bragg reflectors 109 can be doped with the p-type dopant.

Active area 107 is also made of a variety of layers. Briefly, active area 107 is most simply made of a quantum well with barrier regions on either side of the quantum well using any suitable materials. Generally, the barrier regions and the quantum well are made of undoped aluminum gallium arsenide and gallium arsenide each having thicknesses of approximately 100 Angstroms, respectively. Further, it should be understood by one of ordinary skill in the art that additional barrier layers and quantum wells can be added to improve performance of active area 107.

Contact region 111 is made of layer 112 and conductive layer 113. Layer 112 is made of gallium arsenide disposed or grown by any suitable epitaxial method. Typically, layer 112 is grown with a thickness ranging form 100 to 500 Angstroms, having a preferred thickness range from 100 to 300 Angstroms, and a nominal thickness of 100 Angstroms.

Conductive layer 113 is made of any suitable conductive material, such as a metal, e.g., gold (Au), silver (Ag) copper (Cu), aluminum (Al), tungsten (W), an alloy, e.g., aluminum/copper (Al/Cu), titanium tungsten (TiW), or the like. Deposition of conductive layer 113 on layer 112 is achieved by any suitable method or technique, such as sputtering, evaporation, and the like. Additionally, it should be understood that specific thicknesses of conductive layer 113 can change with specific applications and designs. Thickness of conductive layer 115 can range from 2,000 to 10,000 Angstroms, with a preferred range from 3,000 to 8,000 Angstroms, and having a nominal thickness of 4,000 Angstroms.

Layer 115 is made of any suitable dielectric material, such as silicon dioxide ($SiO_2$), silicon nitride ($Si_3N_4$), or the like. Additionally, any suitable method or technique, such as Chemical Vapor Deposition (CVD), e.g., Low Pressure Chemical Vapor Deposition (LPCVD), Plasma Enhanced Chemical Vapor Deposition (PECVD), or the like is used for disposing or depositing layer 115 on conductive layer 113. While specific thicknesses of layer 115 change with specific applications and designs, thickness of layer 115 can range from 3,000 to 8,000 Angstroms, with a nominal thickness of 4,000 Angstroms.

As shown in FIG. 1, masking layer 117 is patterned to make opening 121 that exposes a portion of surface 116. Masking layer 117 is made of any suitable lithographic process, such as photolithography, X-ray lithography, or the like. Generally, lithographic processes are well known in the art; however, by way of example, a brief explanation of a positive photolithographic process is provide hereinbelow.

Briefly, a photolithographic material, such as photoresist, or the like is applied to surface 116 of layer 115. The photolithographic material is exposed with a pattern of light and developed, thereby providing open areas, illustrated by opening 121 having size 122 being on the order of 15 microns, as well as covered areas, illustrated by masked areas 123. The pattern that is used to expose the photolithographic material can form any number of geometric patterns and designs, such as rings, ovals, lines, squares, or the like. In the present case a ring is formed in masking layer 117, thereby making opening 121 and exposing a portion of surface 116 of layer 115.

After exposing and developing processes of masking layer 117, substrate 103 is ready to be etched. Substrate 103 is etched in any suitable etch system that provides an anisotropic etch profile. Further, any suitable etch chemistry is used for etching substrate 103, such as a fluorine based chemistry, a chlorine based chemistry, or the like. Generally, fluorine based chemistry is used to etch or remove a variety of materials, such as nitride, silicon dioxide, tungsten, titanium tungsten, and the like; whereas the chlorine based chemistry also is used to remove a variety of materials, such as semiconductor materials, e.g., silicon, gallium arsenide, aluminum gallium arsenide, as well as conductive materials, such as aluminum, e.g., copper, aluminum, and the like. Additionally, it should be understood that these chemistries can be used in the same etching system, thereby enabling a multitude of layers or different materials to be etched in one etching system. Thus, the process of manufacturing a vertical surface emitting laser is more manufacturable.

More specifically, with layer 115 being nitride, with conductive layer 113 being titanium tungsten, layer 112 and with the stacks of distributed Bragg reflectors 109 being gallium arsenide based with appropriate layers, layer 115 and conductive layer 113 are etched in the fluorine based chemistry using gas sources, such as triflouromethane (CHF$_3$) tetraflouromethane (CF$_4$), or the like, and layer 112 and the first stack of distributed Bragg reflectors 109 are etched in the chlorine based chemistry using gas sources, such as Boron triChloride (BCl$_3$), Silicon tetrachloride (SiCl$_4$), and the like. Process parameter values for the gaseous plasma include pressure, power, and DC Bias. Generally, pressure can range from 5 millitorrs to 200 millitorrs, with a preferred range from 10 to 100 millitorrs, and a nominal value of 20 millitorrs. Power, as measured by Radio Frequency Watts, can range from 20 to 1,500 Watts, with a preferred range from 50 to 1,200 Watts, and a nominal value of 90 Watts. DC Bias, as measured by Voltage Direct Current (VDC), can range from 200 to 1000 VDC, with a preferred range from 300 to 700 VDC, and a nominal value 500 VDC. It should be understood by one of ordinary skill in the art that the values presented hereinabove are approximate and are dependent upon specific pieces of equipment.

Figure 2:
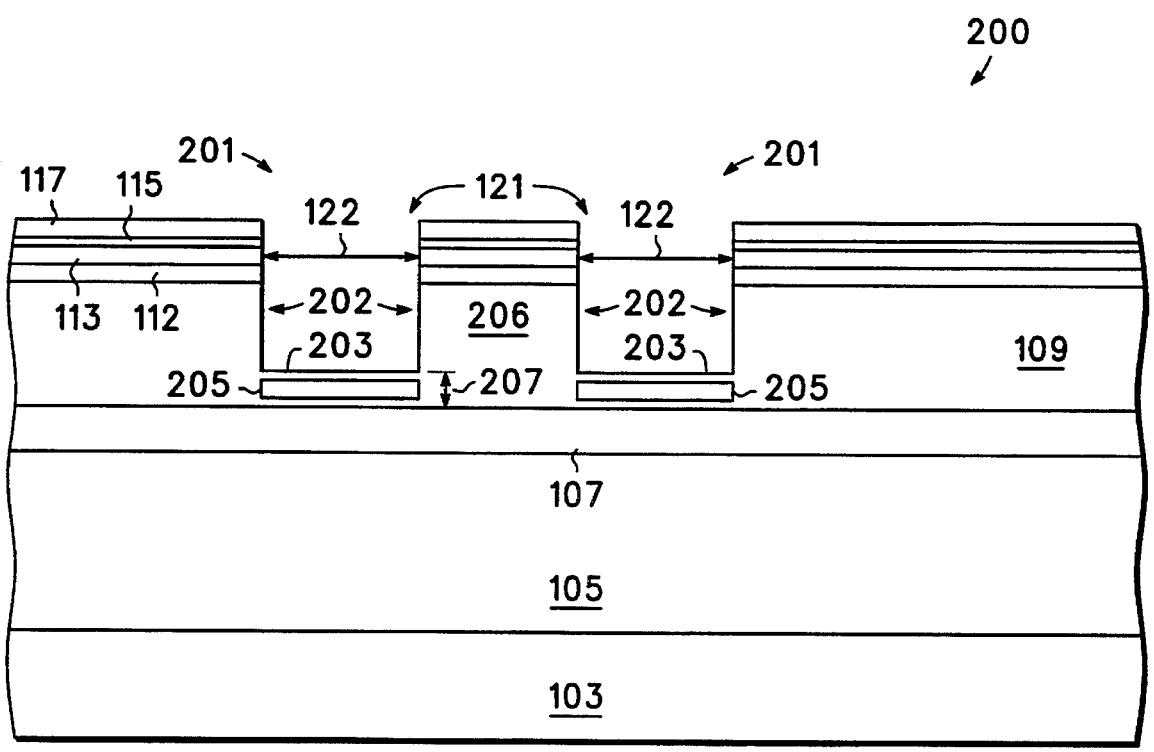
FIG. 2 is a sectional view of the substrate, as shown in FIG. 1, after an etch process to the partially completed ridge vertical cavity surface emitting laser.

FIG. 2 is a sectional view of substrate 103, as shown in FIG. 1, after etching to generate a trench 201 in partially completed vertical cavity surface emitting laser 200. It should be understood that elements and figures previously identified in FIG. 1 will retain their original identifying numerals. As shown in FIG. 2, the partially fabricated VCSEL 100 is further illustrated with a trench 201 having sidewalls 202 and a bottom 203, a ridge structure or ridge 206, a region 205, and a distance 207.

With substrate 103 being etched anisotropically, sidewalls 202 typically have a vertical orientation in which little lateral dimensionality of opening 121 is lost. That is, size 122 of opening 121 of masking layer 117 is transferred to a material that is under masking layer 117. For example, size 122 of opening 121 is transferred through layer 115, conductive layer 113, layer 112, and into a portion of second stack of distributed Bragg reflectors 109.

Etching of substrate 103 continues until distance 207 from bottom 203 to active area 107 is achieved. Distance 207 is measured as a distance from active area 107 to bottom 203. Typically, distance 207 can range from 1 microns or less, with a preferred distance of 0.75 microns or less, with a nominal distance of 0.5 micron or less. Accurate determination of distance 207 is achieved by any suitable detection method of such as time, an optical end point, gaseous emission end point, or the like. Etching of substrate 103 generates ridge 206 that is partially isolated from a remainder of bulk material of the second stack of distributed Bragg reflectors 109.

Optionally, once the etch is completed, a region 205 can be formed in the second stack of distributed reflectors 109, thereby further isolating ridge 206. Region 205 locally disrupts conductivity of the second stack of distributed reflectors 109, thereby confining a current to ridge structure 206. Generally, region 205 is made by implanting ions in bottom 203 of trench 201. Implantation of atoms in bottom 203 is achieved by implanting any suitable ion, such as boron, oxygen, or hydrogen. However in a preferred embodiment of the present invention, hydrogen atoms are used. Typically, the hydrogen atoms are implanted with an energy and dose that range from 40 to 60 keV, with a preferred range from 45 to 55 keV, and nominal value of 50 keV, and 2E12 to 2E16/cm2, with preferred range from 2E13 to 2E15/cm$^2$, with a nominal value of 2E14/cm$^2$, respectively. It should be understood that both the etch and the implantation of ions should be kept above active area 107 so as to achieve good reliability. Additionally, it should be further understood that masking layer 117 of substrate 103 can be cleaned at various stages of processing, such as after the etch processes and after the ion implantation process.

Figure 3:
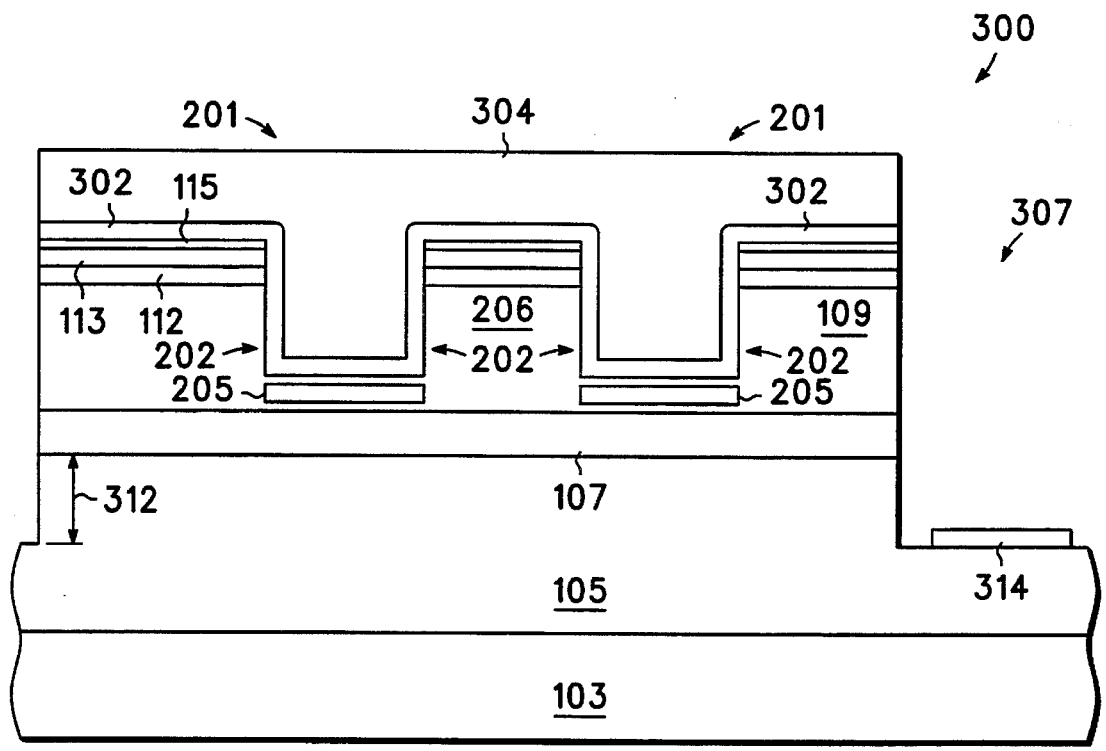
FIG. 3 is a sectional view of the substrate, as shown in FIG. 2, after deposition of a layer to the partially completed ridge vertical cavity surface emitting laser.

FIG. 3 is a sectional view of substrate 103, as shown in FIG. 2, after deposition of a layer 302 on partially completed vertical cavity surface emitting laser 300. It should be understood that elements and figures previously identified in FIGS. 1 and 2 will retain their original identifying numerals. As shown in FIG. 3, the partially fabricated VCSEL 300 is further illustrated with a layer 302, a masking layer 304, a trench 307, and a contact 314.

Generally, layer 302 has been deposited or disposed on partially fabricated VCSEL 300, thus covering sidewalls 202 and bottom 203, as well as layer 115. Additionally, it should be noted that the deposition of layer 302 is achieved conformally, thus applying roughly equal amounts of layer 302 on all surfaces. Further, layer 302 is similar to layer 115 as described hereinabove, thus layer 302 is not described in detail at present.

Generally, layer 302 and masking layer 304 are applied and processed in a similar fashion as layer 115 and masking layer 117 as described hereinabove, thus the processing of these layers is not described in detail. Masking layer 304 is applied to substrate 103, thus covering layer 302, as well as filling trench 201. Typically, masking layer 304 is patterned in a circular of oval structure, wherein the circular or the oval structure covers ridge 206 and trench 201, thus protecting ridge structure 206 and trench 201 from a subsequent etch.

Once masking layer 304 is patterned, substrate 103 is etched as previously described with reference to FIG. 2. However, in this etch, etching is continued into the first stack of distributed Bragg reflectors 105. Typically, the etch is discontinued when a depth 312 or more is reached. Depth 312 can range 0.5 micron or more. End point or discontinuation of the etch process has been previously described.

After the etching of substrate 103 has been completed, contact 314 may be formed. Contact 314 is formed by any suitable method, such as a subtractive method, an additive method, or the like. Generally, the subtractive method is achieved by depositing a material, patterning the material with a mask that exposes areas and covers areas of the material, and etching the exposed area of the material away. Alternatively, the additive method is achieved by patterning the material with a mask having exposed areas and covered areas of the material, depositing a material on the mask and the exposed areas, and washing away the mask, thereby leaving the disposed material on the exposed areas.

In a preferred embodiment of the present invention, contact 314 is made by the additive method. For example, a masking layer is applied to substrate 103 and patterned. The pattern provides an opening to the first stack of distributed Bragg reflectors 105. So as to ensure that the opening is clear and that a good ohmic contact can be made, the opening typically is flushed with dilute Hydrofluoric acid (HF). Subsequently, nickel germanium gold, nickel germanium tungsten, nickel germanium aluminum, or the like is deposited on the opening and the masking layer. The masking layer is then washed away leaving the metal material in the opening to form contact 314. It should be understood that contact 314 can be run to a convenient position so as to facilitate electrical connection.

Additionally, it should be understood that substrate 103 is cleaned so as to remove all residue material, as well as masking layer 304, thereby making substrate 103 ready for a next deposition.

Figure 4:
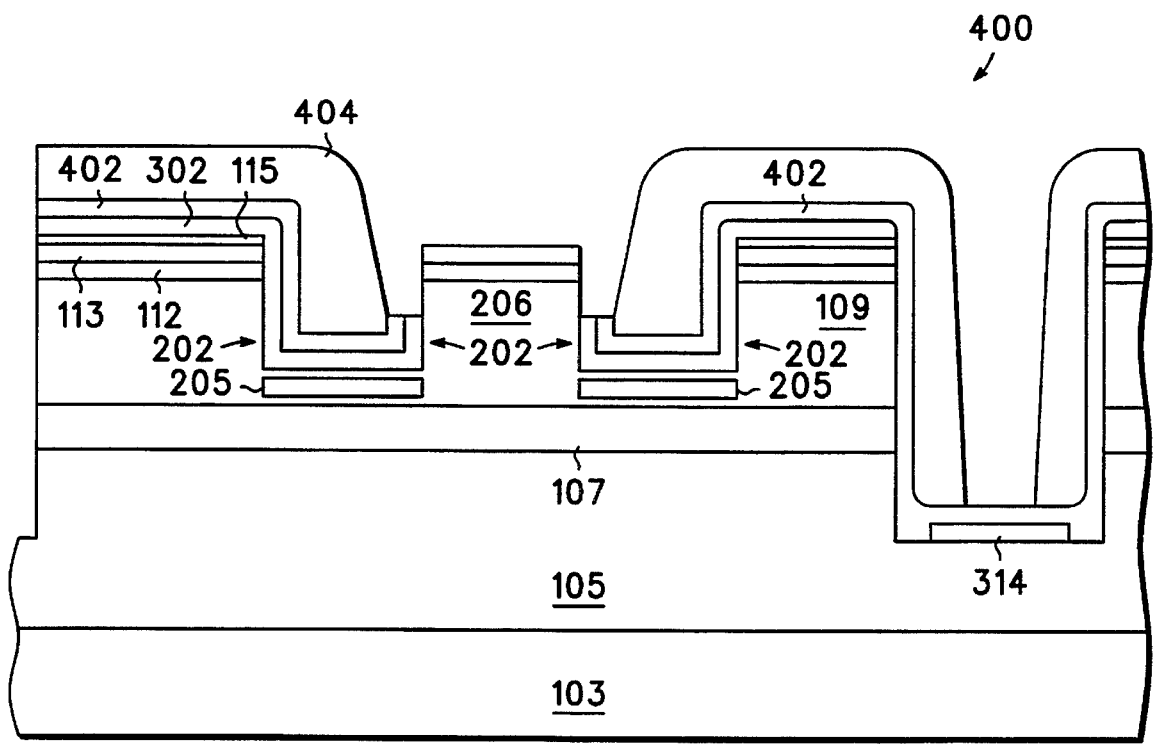
FIG. 4 is a sectional view of the substrate, as shown in FIG. 3, after another etching process to the partially completed ridge vertical cavity surface emitting laser.

FIG. 4 illustrates a layer 402 and a masking layer 404 deposited or disposed on partially fabricated vertical cavity surface laser 400. A masking layer 404 is exposed and developed, and subsequently etched to expose conductive layer 113 of ridge 206 and contact 314. It should be understood that elements and figures previously identified in FIGS. 1–3 will retain their original identifying numerals.

Generally, layer 402 is disposed or deposited in a similar fashion as layer 115 as described hereinabove, thus not necessitating a detailed description. Briefly, layer 402 is deposited on substrate 103, thereby covering layer 302 and contact 314 with layer 402. Masking layer 404 is subsequently applied, exposed and developed to expose ridge 206 with layers 115, 302 and 402 thereon, as well as a portion of contact 314. In some applications, masking layer 402 is exposed twice, once to expose ridge 206, and once to expose layer 402 on contact 314.

Substrate 103 is then etched in a fluorine based chemistry as previously described to remove the exposed layers 115, 302 and 402, thereby exposing conductive layer 113 of ridge 206, and contact 314. Additionally, it should be noted that masking layer 404 protects other areas of the partially completed vertical cavity surface emitting laser 400. Substrate 103 is subsequently cleaned to remove debris, as well as remaining masking layer 404.

Figure 5:
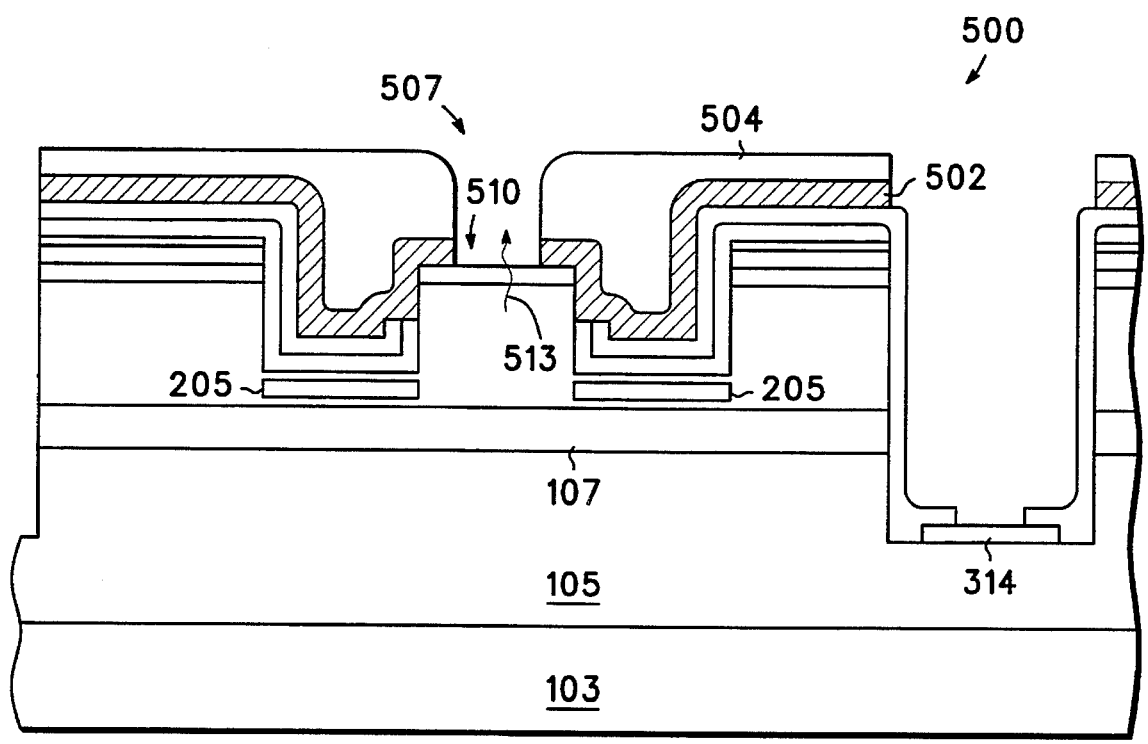
FIG. 5 is a sectional view of the substrate, as shown in FIG. 4, after removal of a layer of the partially completed ridge vertical cavity surface emitting laser.

FIG. 5 is a sectional view of substrate 103, as shown in FIG. 4, after deposition of a conductive layer 502 and application, exposure, development of masking layer 504 with a subsequent etch of substrate 103. It should be understood that elements and figures previously identified in FIGS. 1–4 will retain their original identifying numerals. As shown in FIG. 5, the partially fabricated vertical cavity surface emitting laser 500 is further illustrated with a conductive layer 502, a masking layer 504, opening 507, opening 510, and light 513.

Conductive layer 502 is made of any suitable conductive material, such as a metal, e.g., aluminum, copper, tungsten, titanium, or the like, an alloy, e.g., aluminum/copper, titanium tungsten, or the like, or a combination of metal or alloy layer or layers, e.g., aluminum, gold, titanium/tungsten, or the like. In a preferred embodiment of the present invention, conductive layer 502 is made of a combination of layers. More specifically, a layer of titanium/tungsten is disposed or deposited on substrate 103 as previously described with reference to conductive layer 113.

Briefly, the titanium/tungsten (titungsten) layer is deposited having a thickness ranging from 2,000 to 6,000 Angstroms, with a preferred range from 3,000 to 5,000 Angstroms, and a nominal thickness value of 4,000 Angstroms. Additionally, another layer of either gold or aluminum is deposited on the titanium/tungsten layer. Typically, the gold or the aluminum layer is deposited having a thickness ranging from 500 to 1,500 Angstroms, with a preferred range from 700 to 1,300 Angstroms, and a nominal thickness value of 1000 Angstroms.

Masking layer 504 is subsequently applied to conductive layer 502, exposed and developed to expose opening 507. Substrate 103 including opening 507 is etched by any suitable method or technique, such as the gaseous plasma as described herein above, or a wet chemical etched. With conductive layer 502 being made of several materials, such as a titanium/tungsten layer with a layer of either gold or aluminum, conductive layer 502 is etched with a combination of etching techniques depending upon specific material compositions. Regarding the etching of the gold or aluminum layer, if gold is used a potassium iodide etchant is used; however, if aluminum is used a potassium hydroxide etchant is used. Regarding the etching of the titanium/tungsten, a dry etch having a fluorine based chemistry is used. By etching or removing conductive layer 502 through opening 507 of masking layer 504, window or opening 510 is fabricated, thereby allowing light 513 to exit ridge 206 when properly excited.

Further, it should be understood that substrate 103 is cleaned so as to remove all residue material, as well as masking layer 504, thereby making substrate 103 ready for a next application. After completion of the etched, substrate 103 is cleaned to remove debris and remaining masking layer 504, thereby.

Figure 6:
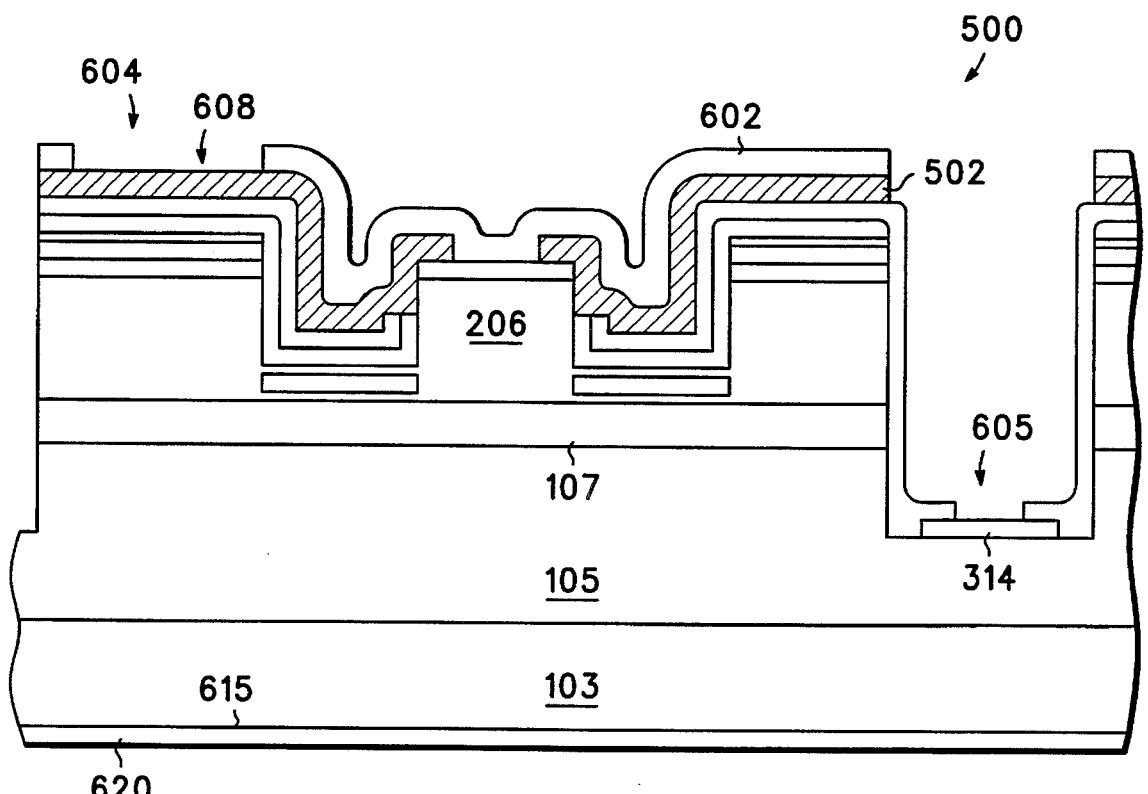
FIG. 6 is an example of a ridge vertical cavity surface emitting laser.

FIG. 6 is a sectional view of substrate 103, as shown in FIG. 5, after an antireflective coating layer 602 is applied and processed. It should be understood that similar elements and features previously identified in FIGS. 1–5 will retain their original identifying numerals. As shown in FIG. 6, an example of a vertical cavity surface emitting laser 500 is further illustrated with windows 604 and 605 being etched to expose conductive layer 502 and contact 314.

Antireflective coating layer 602 is any suitable material, such as a nitride material, an organic material, or the like. In a preferred embodiment of the present invention, a nitride layer is disposed or deposited on substrate 103, thereby forming antireflective coating layer 602. Generally, with antireflective coating layer 602 being the nitride layer, the nitride layer is similar to layer 115 as described hereinabove, thus nitride layer processing is not further described at present.

Briefly, the nitride layer is deposited on substrate covering conductive layer 502 and layer 112 of ridge 206. A masking layer is disposed or applied to the nitride layer. The masking layer is exposed, developed, and etched as previously described to form window 604, thus forming contact 608. Contacts 314 and 608 enable electrical excitation or coupling of active area 107. The current in active area 107 excites active area 107 to release photons. The photons are then reflected between the stacks of distributed Bragg reflectors 105 and 109, thereby lasing the photons and emitting light 513 from ridge 206.

Additionally, while window 604 provides contact 608 capable of bonding, additional conductive materials can be added to contact 608 to enhance bondability for electrical connection. For example, gold (Au) bumps can be added on contact 608. Further, surface 615 of substrate 103 can also be made into a contact 620. Typically, a combination of layers, e.g., nickel/germanium/gold are deposited on surface 615 of substrate 103. Substrate 103 and the combination of layers are then annealed to combine the combination of layers into the substrate 103. Any suitable annealing process can be used. However, in a preferred embodiment of the present invention, a Rapid Thermal Anneal (RTA) at 450 degrees Celsius is used.

By now it should be appreciated that a novel method for fabricating a VCSEL has been provided. This method for making a VCSEL provides a low resistance and low power consuming device that is highly manufacturable. Thus, a VCSEL made with this method can be utilize in a wide variety of applications.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method for making a ridge vertical cavity surface emitting laser comprising the steps of:

providing a substrate with a surface, the surface having disposed thereon a first stack of distributed Bragg reflectors, an active area, a second stack of distributed Bragg reflectors, a contact region, and a dielectric layer, wherein the first stack of distributed Bragg reflectors are on the surface, wherein the active area is on the first stack of distributed Bragg reflectors, wherein the second stack of distributed Bragg reflectors are on the active area, wherein the contact region is on the second stack of distributed Bragg reflectors, and wherein the dielectric layer is on the contact region;

patterning a first isolation trench through the dielectric layer, the contact region, and into a portion of the second stack of distributed Bragg reflectors making a ridge, wherein the first isolation trench encloses a portion of the dielectric layer, the contact area and a portion of the second stack of distributed Bragg reflectors;

patterning a second isolation trench circumscribing the first isolation trench through the dielectric layer, the contact region, the second stack of distributed Bragg reflectors, the active region and a portion of the first stack of distributed Bragg reflectors;

forming a first electrical contact on the first stack of distributed Bragg reflectors; and forming a second electrical contact on the contact region of the ridge.

2. A method for making a ridge vertical cavity surface emitting laser as claimed in claim 1 where, in the step of patterning the first isolation trench through the dielectric layer, the contact region, and into a portion of the second stack of distributed Bragg reflectors, the portion of the second stack of distributed Bragg reflectors patterned having a distance ranging from 1.0 micron or less from the active area.

3. A method for making a ridge vertical cavity surface emitting laser as claimed in claim 2 wherein the portion of the second stack of distributed Bragg reflectors patterned having a distance ranging from 0.75 micron or less.

4. A method for making a ridge vertical cavity surface emitting laser as claimed in claim 3 wherein the portion of the second stack of distributed Bragg reflectors ranges is on the order of 0.5 micron.

5. A method for making a ridge vertical cavity surface emitting laser as claimed in claim 1 where, in the step of providing a substrate with a surface, the surface having disposed thereon a first stack of distributed Bragg reflectors, an active area, a second stack of distributed Bragg reflectors, a contact region, the providing of the contact region further includes the steps of:

forming a gallium arsenide layer on the second stack of distributed Bragg reflectors; and forming a metal layer on the gallium arsenide layer.

6. A method for making a ridge vertical cavity surface emitting laser as claimed in claim 1 where, in forming a first electrical contact on the first stack of distributed Bragg reflectors, the first electrical contact on the first stack of distributed Bragg reflectors is achieved with a lift-off process.

7. A method for making a vertical cavity surface emitting laser comprising the steps of:

providing a substrate with a surface, the surface having disposed thereon a first stack of distributed Bragg reflectors, an active area, a second stack of distributed Bragg reflectors, and a contact region;

disposing a first silicon nitride layer on the contact region;

masking the first silicon nitride layer, thereby generating exposed portions of the first silicon nitride layer and nonexposed portions of the first silicon nitride layer are covered, wherein at least one of the exposed portions surrounds a nonexposed portion;

etching the exposed portions of the first silicon nitride layer through the contact region, and a portion of the second stack of distributed Bragg reflectors, thereby forming a first isolation trench surrounding a mesa;

implanting the surface of the substrate with hydrogen forming a confining region;

depositing a second layer of silicon nitride on the substrate;

masking the second layer silicon nitride, wherein the masking covers the mesa and the first isolation trench while exposing another portion away from the first isolation trench;

etching the exposed another portion of the second layer silicon nitride to remove the exposed portion of the second layer of silicon nitride as well as the contact region, the second stack of distributed Bragg reflectors, the active region, and a portion of the first stack of distributed Bragg reflectors, thereby forming a second isolation region;

forming a metal contact on the first stack of distributed Bragg reflectors forming an isolation trench;

depositing a third layer of silicon nitride on the substrate;

masking the third layer of the silicon nitride, wherein the masking exposes the third layer of silicon nitride covering the mesa;

etching the third layer of the silicon nitride, thereby removing the third layer of silicon nitride covering the mesa;

depositing a conductive material on the substrate, masking the conductive material, wherein a portion of the conductive material on the mesa is exposed;

etching the conductive material, thereby removing the portion of conductive material exposed on the mesa;

disposing an anti-reflective coating on the surface of the substrate;

masking the anti-reflective coating, wherein a portion of the anti-reflective coating on the conductive material is exposed; and etching the exposed portion of the anti-reflective coating, thereby removing the anti-reflective coating and exposing a portion of the conductive material.

8. A method for making a vertical cavity surface emitting laser as claimed in claim 7 where, in the step of forming a metal contact on the first stack of distributed Bragg reflectors, the metal contact is formed with a lift-off process.

\* \* \* \* \*